US006856144B2

(12) United States Patent
Lasalandra et al.

(10) Patent No.: US 6,856,144 B2
(45) Date of Patent: Feb. 15, 2005

(54) METHOD AND CIRCUIT FOR DETECTING MOVEMENTS THROUGH MICRO-ELECTRIC-MECHANICAL SENSORS, COMPENSATING PARASITIC CAPACITANCES AND SPURIOUS MOVEMENTS

(75) Inventors: Ernesto Lasalandra, Montu' Beccaria (IT); Tommaso Ungaretti, Pavia (IT); Andrea Baschirotto, Tortona (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 218 days.

(21) Appl. No.: 10/081,134

(22) Filed: Feb. 20, 2002

(65) Prior Publication Data

US 2002/0175692 A1 Nov. 28, 2002

(30) Foreign Application Priority Data

Feb. 21, 2001 (IT) ...................................... TO2001A0157

(51) Int. Cl.[7] .............................................. G01R 27/26
(52) U.S. Cl. ..................................................... 324/661
(58) Field of Search .............................. 324/684, 76.79, 324/662, 661; 73/514.17, 514.18, 514.16

(56) References Cited

U.S. PATENT DOCUMENTS

| 3,986,109 A | * 10/1976 | Poduje ........................ 324/662 |
|---|---|---|
| 4,054,833 A | 10/1977 | Briefer ....................... 324/60 C |
| 4,208,625 A | * 6/1980 | Piso ............................ 324/671 |
| 4,287,471 A | * 9/1981 | Ko et al. ..................... 324/725 |
| 4,860,232 A | 8/1989 | Lee et al. ............... 364/571.04 |
| 2003/0052699 A1 | 3/2003 | Lasalandra et al. ......... 324/662 |

FOREIGN PATENT DOCUMENTS

FR 2 706 038 12/1994

OTHER PUBLICATIONS

Lemkin, M. et al., "A Three–Axis Micromachined Accelerometer with a CMOS Position–Sense Interface and Digital Offset–Trim Electronics," *IEEE Journal of Solid–State Circuits*, 34(4):456–468, Apr. 1999.

* cited by examiner

*Primary Examiner*—N. Le
*Assistant Examiner*—Amy He
(74) *Attorney, Agent, or Firm*—Lisa K. Jorgenson; Harold H. Bennett, II; Seed IP Law Group PLLC

(57) ABSTRACT

Method for detecting movements through a micro-electric-mechanical sensor, having a fixed body and a moving mass, forming at least one first and one second detection capacitor, connected to a common node and to a first, respectively a second detection node and having a common detection capacitance at rest and a capacitive unbalance in case of a movement. The method includes the steps of: feeding the common node with a constant detection voltage of predetermined duration; generating a feedback voltage to maintain the first and the second detection node at a constant common mode voltage; generating a compensation electric quantity, inversely proportional to the common detection capacitance at least in one predetermined range; supplying the compensating electric quantity to the common node; and detecting an output quantity related to the capacitive unbalance.

26 Claims, 4 Drawing Sheets

METHOD AND CIRCUIT FOR DETECTING MOVEMENTS THROUGH MICRO-ELECTRIC-MECHANICAL SENSORS, COMPENSATING PARASITIC CAPACITANCES AND SPURIOUS MOVEMENTS

BACKGROUND OF THE INVENTION

1. Field of the Invention

The present invention relates to a method and a circuit for detecting movements through micro-electric-mechanical sensors, compensating parasitic capacitances and spurious movements.

2. Description of the Related Art

As is known, the use of micro-electric-mechanical sensors, or MEMS sensors, with differential capacitive unbalance has been proposed for forming, for example, linear or rotational accelerometers and pressure sensors.

In particular, MEMS sensors of the indicated type comprise a fixed body (stator) and a moving mass, generally made of suitably doped semiconductor material, connected to each other through elastic elements (springs) and restrained so that, with respect to the stator, the moving mass has predetermined translational and rotational degrees of freedom. Moreover, the stator and the moving mass have a plurality of fixed and, respectively, moving arms, interleaved to each other. In practice, each fixed arm is arranged between a pair of moving arms, so as to form a pair of capacitors having a common terminal and a capacitance which is a function of the relative position of the arms, that is on the relative position of the moving mass with respect to the stator. When the sensor is stressed, the moving mass moves and the capacitance of the capacitors is unbalanced.

Depending on the type of structure and relative movement allowed between the moving mass and the stator, it is possible to manufacture MEMS sensors of a linear or rotational type, with variable interspace (distance between each moving arm and the respective fixed arms) and/or with variable facing area (variation of the reciprocal facing area between the moving arms and the respective fixed arms).

In all mentioned cases, reading by the sensor (that is the detection of an electric quantity representing the variation of the capacitance of the capacitors) leads to problems due to the presence of parasitic capacitances (pad and substrate capacitances).

To overcome this problem, a method and a circuit for reading MEMS sensors have been proposed in "A Three-Axis Micromachined Accelerometer with a CMOS Position-Sense Interface and Digital Offset-Trim Electronics" by M. Lemkin, B. Boser, IEEE Journal of Solid-State Circuits, Vol. 34, N. 4, Pages 456–468.

In the mentioned article, in particular, reference is made to a sensor MEMS 1 of linear type, illustrated, for greater clarity, in FIGS. 1 and 2; however, the following description applies to MEMS sensors of any type.

In detail, the sensor 1 comprises a stator 2 and a moving mass 3, connected to each other by springs 4 so that the moving mass 3 can translate parallel to a first reference axis X, while it is substantially fixed with respect to a second and a third reference axis Y, Z. The sensor 1 is also symmetrical with respect to a longitudinal axis parallel to the first reference axis X.

The a stator 2 and the moving mass 3 are provided with a plurality of first and second fixed arms 5', 5" and, respectively, with a plurality of moving arms 6, extending substantially parallel to the plane Y-Z.

As shown in detail in FIG. 2, each moving arm 6 is arranged between two respective fixed arms 5', 5", partially facing them. Consequently, the moving arm 6 forms with the two fixed arms 5', 5" a first and, respectively, a second detection capacitor 8, 9 with parallel flat faces. In particular, the area of the plates of the detection capacitors 8, 9 is equal to the facing area A of the moving arms 6 and of the fixed arms 5', 5". In particular, the facing area A is substantially a rectangle with sides Ly, Lz.

The first and the second detection capacitor 8, 9 have a first and, respectively, a second detection capacitance Ca, Cb, given by the equations:

$$Ca = \varepsilon \frac{A}{X1} \quad (1)$$

$$Cb = \varepsilon \frac{A}{X2} \quad (2)$$

where X1, X2 are the distances between the moving arm 6 and the first and, respectively, the second fixed arms 5', 5" of FIG. 2 and $\varepsilon$ is the dielectric constant of the air.

In the sensor 1, all the detection capacitances Ca formed between the moving arms 6 and the first fixed arms 5' are parallel-connected; similarly all the detection capacitances Cb formed between the moving arms 6 and the second fixed arms 5" are parallel-connected. Consequently, altogether two capacitances are present between the stator 3 and the moving mass 4, equal to C1=N*Ca and, respectively, to C2=N*Cb, with N number of moving arms 6 of the sensor 1. If we define as the common detection capacitance Cs of the sensor 1 the value of the capacitances C1, C2 at rest, we have:

$$Cs=C1=C2 \quad (3)$$

After a movement of the moving arm 4 purely along the axis X, the detection capacitances C1, C2 present variations with an opposite sign and with a same absolute value, and equal to a capacitive unbalance $\Delta Cs$.

FIG. 3, showing a simplified electric equivalent of the sensor MEMS 1, shows a detection circuit 10, of the type described in the article mentioned.

In particular, the sensor MEMS 1 is schematized by a first and a second equivalent detection capacitor 11, 12, having first terminals connected to a first and, respectively, a second detection node 13, 14 and second terminals connected to a common node 15. Moreover, the first and the second equivalent detection capacitor 11, 12 have capacitances equal to the first and, respectively, to the second detection capacitance C1, C2. The first and the second detection node 13, 14 are connected to all the first arms 5' and, respectively, to all the second arms 5" of the stator 3, while the common node 15 is connected to the moving mass 4 and therefore to the moving arms 6. Moreover, in FIG. 3 the parasitic capacitances of the sensor MEMS 1 are schematized by parasitic capacitors 17, 18 connected between the detection nodes 13, respectively 14, and the mass.

The detection circuit 10 comprises a detection operational amplifier 20 in a charge integration configuration and a feedback stage 21.

In detail, the detection operational amplifier 20, having a completely differential topology, has an inverting input connected to the first detection node 13 and a non-inverting input connected to the second detection node 14; and it has a non-inverting output 20a and an inverting output 20b between which is an output voltage Vo. Moreover, a first and a second integration capacitor 22, 23, having a same integration capacitance Ci, are connected one between the inverting input and the non-inverting output 20a and the other between the non-inverting input and the inverting output 20b of the detection operational amplifier 20.

The feedback stage 21 comprises an amplifying circuit 25 and a first and a second feedback capacitor 26, 27, having first terminals connected to an output 25a of the amplifying circuit 25 and second terminals connected to the first and, respectively, to the second detection node 13, 14. The amplifying circuit 25, the structure and operation whereof are described in detail in the mentioned article, is a switched-capacitors circuit having a first and a second differential input 25b, 25c, connected to the inverting input and, respectively, to the non-inverting input of the detection operational amplifier 20, and a reference input, connected to a voltage generator 29 that supplies a first reference voltage Vr1. In practice, the amplifying circuit 25, in a first operative step, detects the voltage between the differential inputs 25b, 25c, determines their mean value and, in a second step, outputs a feedback voltage $V_{FB}$ proportional to the difference between this mean value and the first reference voltage Vr1.

The reading by the sensor MEMS 1 is performed supplying the moving mass 4 with a detection voltage Vs with square wave. The feedback stage 20 intervenes so as to maintain the first and the second detection node 13, 14 at a constant voltage. In particular, the feedback voltage $V_{FB}$ supplied by the amplifying circuit 25 is a square wave in phase-opposition with respect to the detection voltage Vs. In this way, the parasitic capacitors 17, 18 have no influence, since they are maintained at a constant voltage and do not absorb any charge, thereby eliminating the error due to the parasitic capacitances of the sensor MEMS 1. The output voltage Vo between the outputs 20a, 20b of the detection operational amplifier 20 is given by the equation:

$$Vo = 2Vs \frac{\Delta Cs}{Ci} \quad (4)$$

wherein, as mentioned previously, ΔCs is the capacitive unbalance of the sensor MEMS 1, that is the capacitance variation of the first and of the second equivalent detection capacitor 11, 12 after movements of the moving mass 4.

The precision of the detection circuit described, however, is limited by another problem, caused by spurious movement, that are not consistent with the allowed degree of freedom and due to the non-ideal nature of the mechanical restraints.

In greater detail, supposing for simplicity's sake that the distances X1, X2 are initially the same and equal to a rest distance X0, from equations (1)–(3) it results that the component ΔCsx of the capacitive unbalance ΔCs according to the first reference axis X is given by the equation:

$$\Delta CSx = -\frac{dCs}{dX}\Delta X = \frac{\varepsilon A}{X0^2}\Delta X = \frac{Cs}{X0}\Delta X \quad (5)$$

where ΔX is the movement of the moving mass 4 along the first reference axis X.

In presence of a spurious movement ΔY parallel to the second reference axis Y, the capacitive unbalance ΔCs has a component ΔCsy given by the equation:

$$\Delta CSy = -\frac{dCs}{dY}\Delta Y = -\frac{\varepsilon Ly}{X0}\Delta Y = -\frac{CS}{Ly}\Delta Y \quad (6)$$

Any spurious movements ΔZ along the third reference axis Z are instead compensated by virtue of the axial symmetry of the sensor MEMS 1.

While the unbalance introduced by the movement ΔX is of a differential type and is itself suitable to be detected by the detection operational amplifier 20, which has a completely differential topology, the movement ΔY introduces a notable common mode variation of the common detection capacitance Cs, as it causes a variation of the facing area A (FIG. 2).

Since the output voltage Vo is directly proportional to the capacitive unbalance ΔCs, which in turn is directly proportional to the common detection capacitance Cs, the common mode variation due to the movement ΔY introduces a significant detection error.

BRIEF SUMMARY OF THE INVENTION

An embodiment of the present invention overcomes the problems described.

According to various embodiment of the present invention, methods for compensating parasitic movements in a micro-electric-mechanical sensor, a method for detecting movements through micro-electric-mechanical sensors and circuits for detection of movements and compensation of spurious movements are provided.

The method for detecting movements through a micro-electric-mechanical sensor having a fixed body and a moving mass, includes forming first and second detection capacitors connected to a common node and to first and second detection nodes respectively, and having a common detection capacitance at rest and a capacitive unbalance in case of a movement. The method includes the steps of: feeding the common node with a constant detection voltage of predetermined duration; generating a feedback voltage to maintain the first and second detection nodes at a constant common mode voltage; generating a compensation electric quantity, inversely proportional to the common detection capacitance at least in one predetermined range; supplying the compensating electric quantity to the common node; and detecting an output quantity related to the capacitive unbalance.

A device according to an embodiment of the invention includes an electro-mechanical sensor having a movable mass and a fixed body, configured to detect motion in a first axis and including first and second detection capacitors formed between the movable mass and the fixed body, the movable mass being a common node of the first and second capacitors, a first circuit, configured to compare capacitances of the first and second capacitors and provide an output voltage proportionate with a difference of capacitances thereof, and a second circuit, configured to supply a compensation voltage to the common node, inversely proportionate to a common capacitance of the sensor.

According to another embodiment of the invention, the device also includes a feedback network having a feedback voltage proportionate with the common capacitance of the sensor, an input coupled with the feedback network, a memory configured to periodically store the level of the feedback voltage, an amplifier configured to receive the stored feedback voltage level during intervals between the periods of storage in the memory and to output the compensation voltage, and an output coupling the amplifier output with the common node.

BRIEF DESCRIPTION OF THE SEVERAL VIEWS OF THE DRAWINGS

For a better understanding of the invention, two embodiments are now described, purely as non-limitative examples, with reference to the enclosed drawings, wherein.

DETAILED DESCRIPTION OF THE INVENTION

Figure 1:
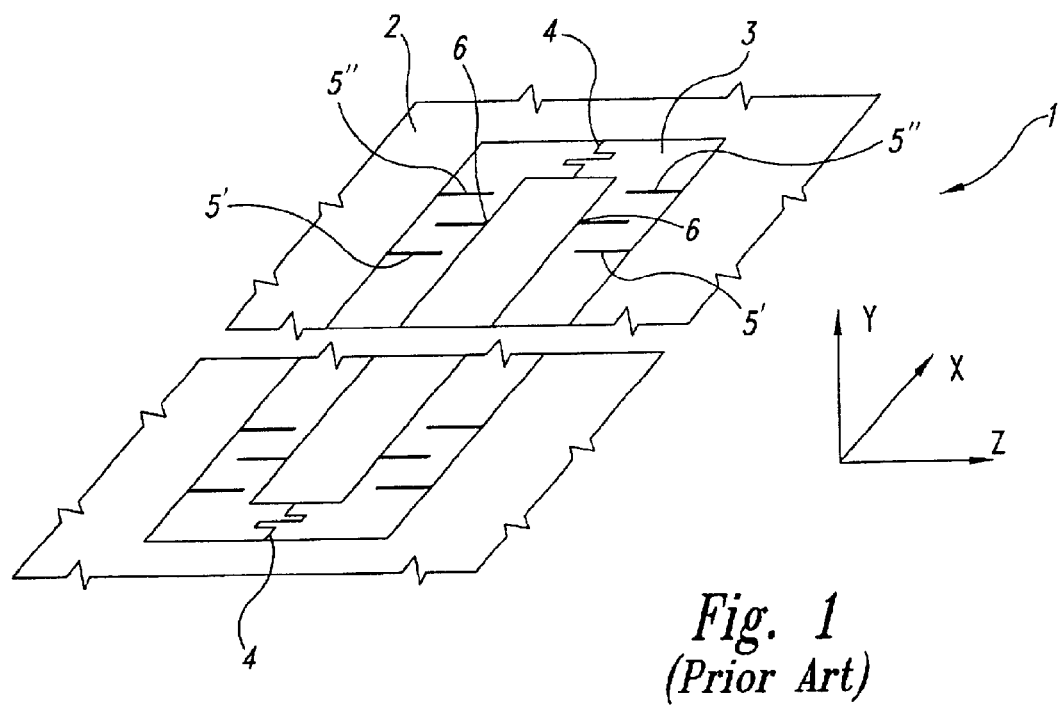
FIG. 1 is a perspective view of a micro-electric-mechanical sensor of a known type.
Figure 2:
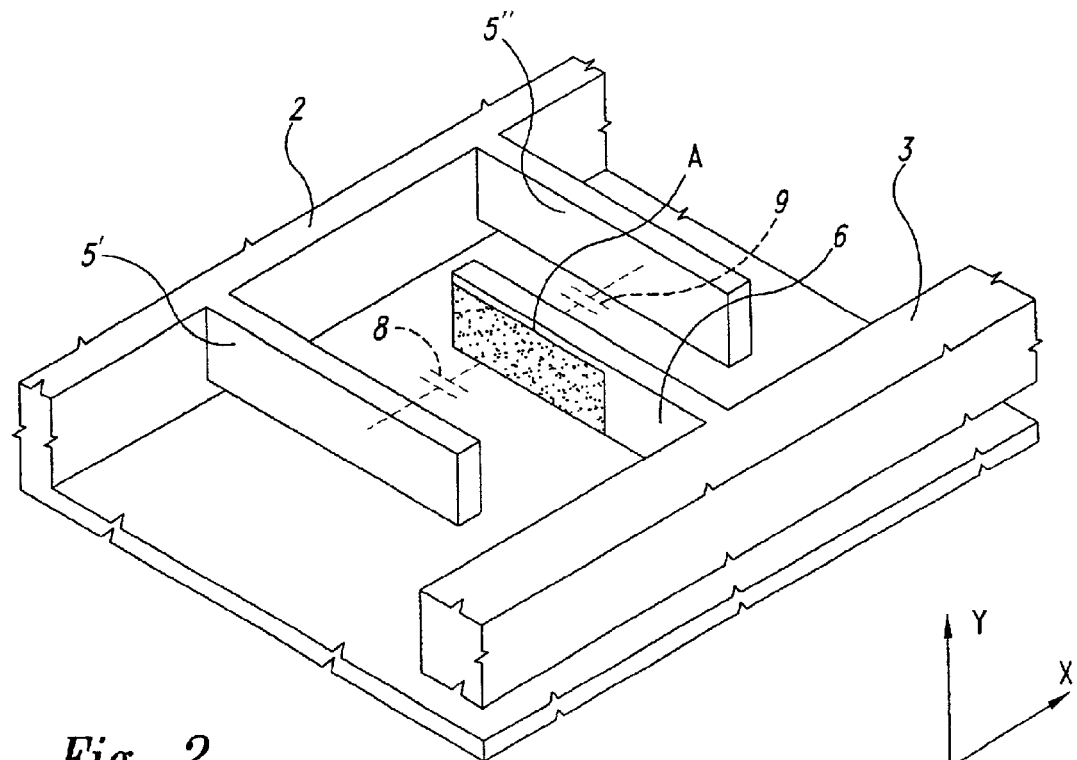
FIG. 2 is an enlarged perspective view of a detail of the sensor in FIG. 1.
Figure 3:
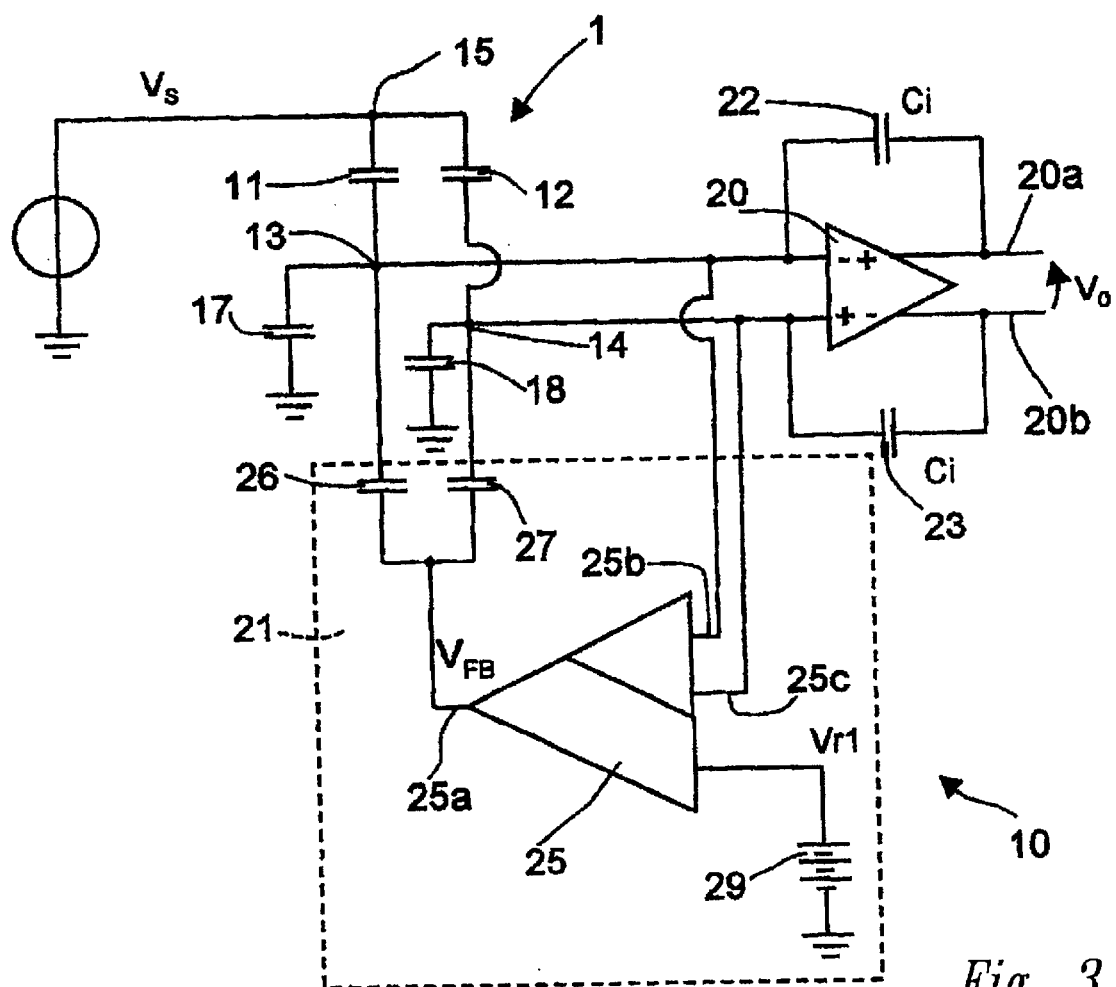
FIG. 3 is a simplified circuit diagram of a detection circuit for a micro-electric-mechanical sensor, of a known type.
Figure 4:
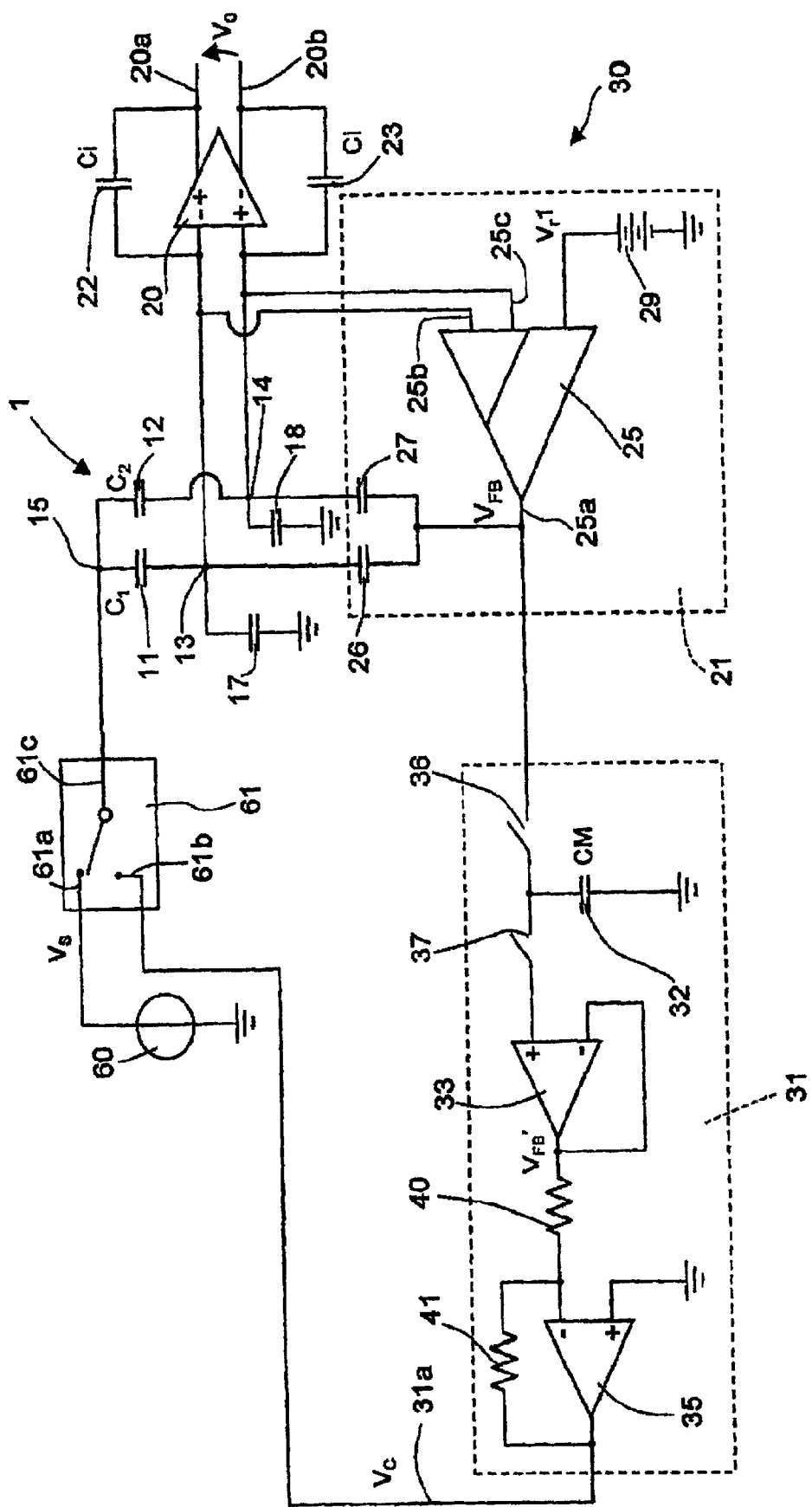
FIG. 4 is a simplified circuit diagram of a detection circuit for a micro-electric-mechanical sensor according to a first embodiment of the present invention.

FIG. 4, in which parts similar to those already shown are indicated with the same reference numbers, illustrates a detection circuit 30 which differs from the detection circuit 10 in FIG. 3 by comprising a compensating stage 31. In particular, the detection circuit 30 is connected to the sensor MEMS 1 (here schematized by the first and the second equivalent detection capacitor 11, 12, connected one between the first detection node 13 and the common node 15 and the other between the second detection node 14 and the common node 15) and comprises the detection operational amplifier 20 and the feedback stage 21. Moreover, a signal generator 60 is connected to a first input 61a of a selector 61, of a known type, having a second input 61b and an output 61c. The output 61c is connected to the common node 15.

As already mentioned, the detection operational amplifier 20, having a completely differential topology, operates as a charge integrator and has an inverting input connected to the first detection node 13 and a non-inverting input connected to the second detection node 14. The feedback stage comprises the amplifying circuit 25, having the differential inputs 25b, 25c connected to the inverting and, respectively, the non-inverting inputs of the detection operational amplifier 20; and the first and the second feedback capacitor 26, 27 connected one between the output 25a of the amplifying circuit 25 and the first detection node 13 and the other between the output 25a of the amplifying circuit 25 and the second detection node 14.

The compensating stage 31 has an input, connected to the output 25a of the amplifying circuit 25, and an output 31a, connected to the second input 61b of the selector 61 and supplying a compensation voltage Vc, linked to the common detection capacitance Cs of the sensor MEMS 1 approximately by an inverse proportional function, as explained in detail below.

The compensating stage 31 comprises a memory capacitor 32, an uncoupling stage 33 and a compensating operational amplifier 35 with negative gain.

The memory capacitor 32 has a first terminal connected to ground and a second terminal connected to the output 25a of the amplifying circuit 25 via a first switch 36 and to the uncoupling stage 33 via a second switch 37, controlled in counterphase with respect to the first switch 36.

The uncoupling stage 33 is preferably formed by an operational amplifier in a follower configuration, that is having a non-inverting input connected to the second switch 37 and an inverting input directly connected to the output.

The compensating operational amplifier 35, configured as an inverting amplifier, has an inverting terminal connected to the output of the uncoupling stage 33 through an input resistor 40, a non-inverting terminal connected to ground and an output forming the output of the compensating stage 31 and supplying the compensating voltage Vc; moreover, the output and the inverting terminal of the compensating operational amplifier 35 are connected to each other through a feedback resistor 41.

It will now be shown that the relationship between the common detection capacitance Cs is linked, in a first approximation, to the compensating voltage Vc by a relationship of inverse proportionality.

In fact, when the moving mass 4 is supplied with the detection voltage Vs, the feedback voltage $V_{FB}$ supplied to the amplifying circuit 25 assumes a value that is directly proportional to the overall detection capacitance Cs, like the output voltage Vo, and may be expressed as follows:

$$V_{FB} = K1 VsCs \qquad (7)$$

where K1 is a first constant. Note also that the amplitude of the detection voltage Vs is constant.

In two successive steps, the feedback voltage $V_{FB}$ is stored and then transferred to the compensating operational amplifier 35 through the uncoupling stage 33.

Therefore, indicating with G the absolute value of the gain of the compensating operational amplifier 35 and with Vc0 the value of the compensating voltage Vc in the absence of input voltage, we have:

$$Vc = Vc0 - GV_{FB} = Vc0 - GK1 VsCs \qquad (8)$$

Figure 5:
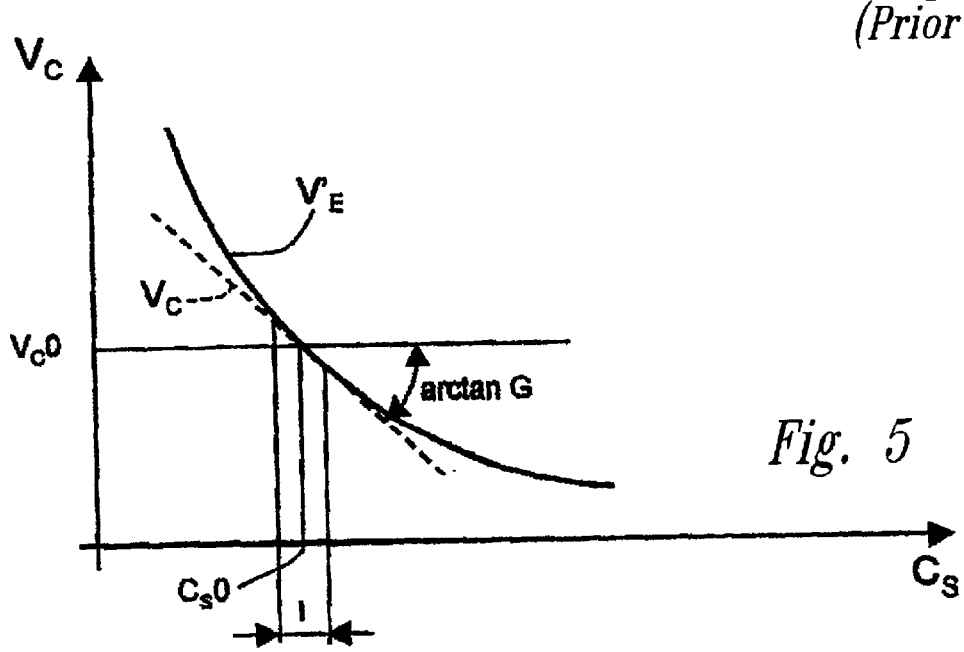
FIG. 5 is a graph of the quantities present in the circuit in FIG. 4.

Since the variations of the common detection capacitance Cs due to the spurious movements ΔY are in the range of femtoFarad, in a predetermined neighborhood I of a rest value Cs0 of the common detection capacitance Cs the equation (8) is a first-degree approximation of a relationship of inverse proportionality given by (see FIG. 5):

$$Vc' = K2/Cs \qquad (9)$$

where Vc' is an ideal compensating voltage and K2 is a second constant.

Therefore, linearising the plot of the compensating voltage Vc in the neighborhood I, a negligible error is made and the following relationship may correctly be considered valid:

$$Vc = Vc' = K2/Cs \qquad (10)$$

In practice, a detection cycle of the sensor MEMS 1 is carried out as follows.

Initially the selector 61 supplies, to the moving mass 4 (represented in FIG. 4 by the common node 15), the constant voltage Vs. According to the detailed description given in the article mentioned, in this condition the amplifying circuit 25 of the feedback stage 21 outputs a value of the feedback voltage $V_{FB}$ such as to maintain constant the common mode voltage between the first and the second detection node 13, 14 (that is the mean between the voltages present on these nodes); moreover, since the detection operational amplifier 20 substantially maintains at zero the voltage existing between its inputs, the first and the second detection node 13, 14 are practically virtual ground points.

Simultaneously, the first switch 36 of the compensating stage 31 is closed (while the second switch 37 remains open) and the memory capacitor 32 is charged to the feedback voltage $V_{FB}$, which is thus stored. In this phase, in practice, the common detection capacitance Cs (proportional to the feedback voltage $V_{FB}$) is detected and then stored so as to be processed later.

Later, the switches 36, 37 switch over, so as to connect the memory capacitor 32 to the compensating operational amplifier 35, through the uncoupling stage 33 and the input resistor 40. Therefore, the output 31a of the compensation stage goes to and substantially remains at the compensating voltage Vc indicated by equation (10).

Moreover, the selector 61 switches over consequently the compensating voltage Vc is fed to the common node 15 (that is to the moving mass 4). In this phase the output voltage Vo is given by the following relationship:

$$Vo = 2\frac{K2}{Ci}\frac{\Delta Cs}{Cs} \qquad (11)$$

Since, according to equations (5), (6), the capacitive unbalance $\Delta Cs$ is given by:

$$\Delta Cs = \Delta Csx + \Delta Csy = Cs\left(\frac{\Delta X}{X0} - \frac{\Delta Y}{Ly}\right) \cong Cs\frac{\Delta X}{X0} \qquad (12)$$

the output voltage Vo is substantially independent of the common detection capacitance Cs. In fact, combining the equations (11) and (12), we obtain:

$$Vo = 2\frac{K2}{Ci}\frac{\Delta X}{X0} \qquad (13)$$

The approximation made in equation (12) is justified because the spurious movements $\Delta Y$, due to construction imperfections and completely absent in case of ideal restraints, are much smaller than the movements $\Delta X$, which are instead expected for normal operation of the sensor MEMS 1; moreover, the quantities X0 and Ly are comparable with each other.

In practice, the dependence of the output voltage Vo on the common detection capacitance Cs which, in a first approximation, follows a direct proportionality relationship, is eliminated by generating a voltage that is inversely proportional to the common detection capacitance Cs and then feeding the voltage thus generated to the moving mass 4.

Figure 6:
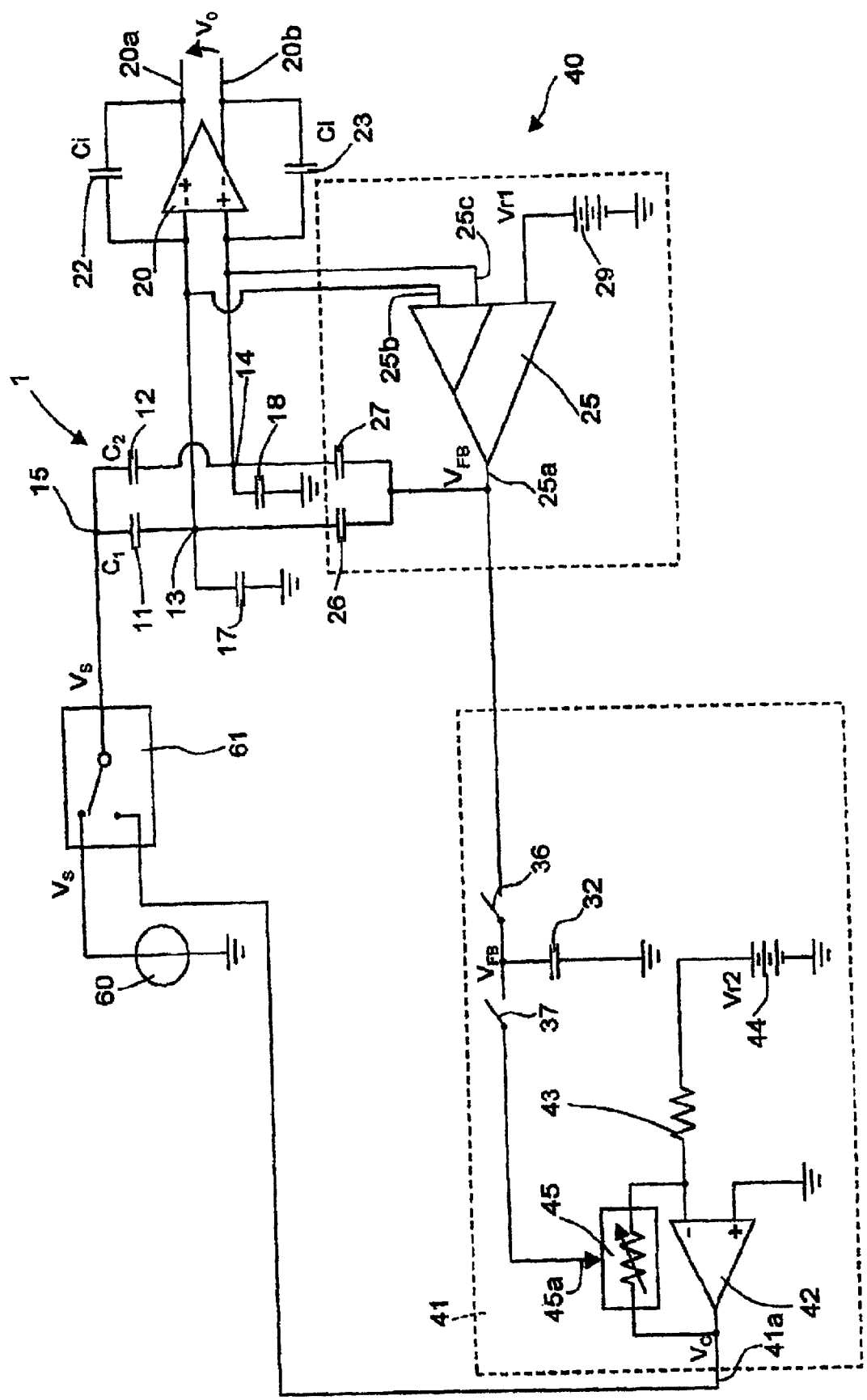
FIG. 6 is a simplified circuit diagram of a detection circuit for a micro-electric-mechanical sensor according to a second embodiment of the present invention.

FIG. 6, wherein parts similar to those already shown are indicated with the same reference numbers, illustrates a second embodiment of the invention. In particular, a detection circuit 40 comprises the detection operational amplifier 20 and the feedback stage 21, connected to each other and to the sensor MEMS 1 as already described with reference to FIGS. 3 and 4. Moreover, a compensating stage 41 comprises the memory capacitor 32, connected to the output 25a of the amplifying circuit 25 through the first switch 36, and a compensating operational amplifier 42, having a non-inverting input connected to ground, an inverting input connected through an input resistor 43 to a voltage source 44, supplying a second constant reference voltage Vr2, and an output forming an output 41a of the compensating stage 41. Moreover, between the output and the inverting input of the compensating operational amplifier 42 is connected a feedback resistive element 45 with variable resistance, having a control terminal 45a connected to the memory capacitor 32 through the second switch 37 to receive the stored feedback voltage $V_{FB}$. The feedback resistive element 45 preferably comprises a transistor MOS operating in a linear zone, the gate terminal of which forms the control terminal 45a.

In this case, in practice, the compensating voltage Vc is controlled by modulating the gain value G' through the feedback voltage $V_{FB}$. Indicating with R1 and R2 the resistance of the input resistor 43 and, respectively, of the feedback resistive element 45, the gain G' is given by the equation:

$$G' = -R2/R1 \qquad (14)$$

Moreover:

$$Vc = G'Vr2 = -G'(R2/R1)Vr2 \qquad (15)$$

Since, in a first approximation, the resistance of a MOS transistor decreases inversely to the gate-source voltage and vice-versa, the resistance R2 of the feedback resistive element 45 is inversely proportional to the feedback voltage $V_{FB}$. Moreover, since, as shown previously, the feedback voltage $V_{FB}$ is directly proportional to the common detection capacitance Cs, from equation (15) derives that, in this case too, the compensating voltage is linked to the common detection capacitance Cs substantially by an inverse proportionality.

From the above it is clear that the invention advantageously allows the elimination of the disturbing effects both of the parasitic capacitances and of the spurious movements caused by mechanical imperfections of MEMS sensors. Consequently, the described detection circuit is much more precise and less prone to errors than traditional detection circuits.

Moreover, the method and the circuit described are extremely versatile and may be used for MEMS sensors with differential capacitive unbalance of any type. In particular, as well as linear sensors with variable interspaces, it is possible to use sensors of rotational type and of the type with variable facing area.

Lastly it is clear that modifications and variations may be made to the method and the circuit described, without departing from the scope of the present invention.

In particular, the compensating stage may be implemented in different ways and supply a compensating voltage which represents an approximation different from the one described; the compensating stage could, for example, be implemented by switched-capacitor circuits.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for compensating parasitic capacitances in a micro-electric-mechanical sensor having a fixed body and a moving mass, forming first and second detection capacitors, connected to a common node and to a first and second detection node respectively and having a common rest detection capacitance, the method comprising:
   feeding said common node with a detection voltage; and
   maintaining said first and second detection node at a constant common mode voltage through a feedback voltage, the maintaining step including feeding said common node with a compensating electric quantity, inversely proportional to said common rest detection capacitance in at least one predetermined interval.

2. A method according to claim 1, further comprising the step of measuring said common rest detection capacitance.

3. A method according to claim 2 wherein said measuring step comprises the steps of:
detecting said feedback voltage; and
storing said feedback voltage.

4. A method according to claim 1, further comprising the step of generating said compensating electric quantity, that is, in a first approximation and in said interval, in inverse proportion to said common rest detection capacitance.

5. A method according to claim 4, wherein said step of generating said compensating electric quantity comprises amplifying said feedback voltage with negative gain.

6. A method according to claim 4, wherein said step of generating said compensating electric quantity comprises the steps of:
supplying amplifying means having a variable gain;
controlling said variable gain through said feedback voltage.

7. A method according claim 1, further including the step of supplying said feedback voltage to said first and second detection node through a first and second feedback capacitor, respectively.

8. A method according to claim 1 wherein said detection voltage is a constant voltage with a predetermined duration.

9. A method according to claim 1 wherein, before performing said step of supplying said compensating electric quantity, the step of removing said detection voltage from said common node is performed.

10. A method for detecting a movement of a micro-electric-mechanical sensor having a fixed body and a moving mass, forming first and second detection capacitors, connected to a common node and to first and second detection nodes, respectively, and having a common detection rest capacitance and a capacitive unbalance following a movement of said moving mass; the method comprising:
feeding said common node with a detection voltage;
maintaining said first and the second detection node at a constant common mode voltage through a feedback voltage;
detecting an output quantity related to said capacitive unbalance; and feeding said common node with a compensating electric quantity, inversely proportional to said common detection rest capacitance in at least one predetermined interval.

11. A circuit for detecting movements through a micro-electric-mechanical sensor having a fixed body and a moving mass, forming first and second detection capacitors, connected to a common node and to first and second detection nodes, respectively and having a common detection rest capacitance; the circuit comprising:
detection amplifying means, having inputs connected to said first and second detection capacitor, respectively and an output supplying an output voltage related to a voltage present on said common node;
a feedback stage, connected to said first and second detection node and generating a feedback voltage, maintaining said first and second detection node at a constant common mode voltage; and
a compensating stage, receiving said feedback voltage and feeding said common node with a compensating electric quantity, inversely proportional to said common detection rest capacitance in at least one predetermined interval.

12. A circuit according to claim 11, wherein said compensating stage comprises memory means connected to said feedback stage and storing said feedback voltage, and a linear amplifier connected to said memory means and having a negative gain.

13. A circuit according to claim 12, wherein said linear amplifier comprises an operational amplifier in inverting configuration, having an inverting input connected to said memory means, a non-inverting input connected to a reference potential line and an output connected to said common node.

14. A circuit according to claim 12, wherein said linear amplifier is a linear amplifier with controllable gain.

15. A circuit according to claim 14, wherein said linear amplifier comprises a variable-resistance resistive element, having a control terminal connected to said memory means.

16. A circuit according to claim 15, wherein said linear amplifier further comprises an operational amplifier having an inverting input connected to a reference voltage source supplying a constant reference voltage, a non-inverting input connected to a reference potential line and an output connected to said common node.

17. A method for compensating for effects of spurious movements of an electro-mechanical sensor in a detection circuit, comprising:
comparing capacitances of first and second detection capacitors formed between a moving mass of the electro-mechanical sensor and a fixed body of the sensor, wherein the moving mass is a common node of the first and second capacitors;
measuring a common detection capacitance of the sensor; and
introducing a compensation voltage, inversely proportionate to the common detection capacitance, to the common node of the sensor.

18. The method of claim 17 wherein the measuring step comprises periodically storing a feedback voltage of the detection circuit.

19. The method of claim 18 wherein the compensation voltage is derived from the stored feedback voltage, and wherein the introducing step comprises introducing the compensation voltage in periods alternating with the periods of the storing step.

20. A device, comprising:
an electro-mechanical sensor having a movable mass and a fixed body, configured to detect motion in a first axis and including first and second detection capacitors formed between the movable mass and the fixed body, the movable mass being a common node of the first and second capacitors;
a first circuit, configured to compare capacitances of the first and second capacitors and provide an output voltage proportionate to a difference of the capacitances; and
a second circuit, configured to supply a compensation voltage to the common node, inversely proportionate to a common capacitance of the sensor.

21. The device of claim 20 wherein the first circuit includes a feedback network having a feedback voltage proportionate with the common capacitance of the sensor.

22. The device of claim 21 wherein the second circuit comprises:
an input coupled with the feedback network;
a memory configured to periodically store the level of the feedback voltage;
an amplifier configured to receive the stored feedback voltage level during intervals between the periods of storage in the memory and to output the compensation voltage; and an output coupling the amplifier output with the common node.

23. The device of claim 22 wherein a gain of the amplifier is modified by the stored feedback voltage level.

24. A method for operating an electro-mechanical sensor in a detection circuit, comprising:

provided by the detecting a change in capacitance of first and second detection capacitors formed between a movable mass of the sensor and a fixed body of the sensor;

providing, during the detecting step, an output value proportionate to a capacitive unbalance between the first and second detection capacitors;

storing, during the detecting step, a value corresponding to a on detection capacitance of the sensor; and compensating, in the detection circuit, and during the detecting step, for changes in the common detection capacitance.

25. The method of claim 24 wherein the compensating step includes introducing to the detection circuit a compensation value, inversely proportionate to the common detection capacitance of the sensor.

26. The method of claim 25 wherein the movable mass is a common node of the first and second capacitors, and wherein the introducing step comprises introducing the compensation value to the common node.

* * * * *

UNITED STATES PATENT AND TRADEMARK OFFICE
CERTIFICATE OF CORRECTION

PATENT NO. : 6,856,144 B2
DATED : February 15, 2005
INVENTOR(S) : Ernesto Lasalandra et al.

It is certified that error appears in the above-identified patent and that said Letters Patent is hereby corrected as shown below:

<u>Column 11</u>,
Line 14, "to a on detection" should read as -- to a common detection --.

Signed and Sealed this

Eleventh Day of October, 2005

JON W. DUDAS
*Director of the United States Patent and Trademark Office*